United States Patent
Qin et al.

(10) Patent No.: US 12,543,358 B2
(45) Date of Patent: Feb. 3, 2026

(54) TRANSITION METAL DICHALCOGENIDE (TMD) TRANSISTOR STRUCTURE

(71) Applicant: INTERNATIONAL BUSINESS MACHINES CORPORATION, Armonk, NY (US)

(72) Inventors: Liqiao Qin, Albany, NY (US); Heng Wu, Santa Clara, CA (US); Ruilong Xie, Niskayuna, NY (US); Tian Shen, Clifton Park, NY (US)

(73) Assignee: International Business Machines Corporation, Armonk, NY (US)

(*) Notice: Subject to any disclaimer, the term of this patent is extended or adjusted under 35 U.S.C. 154(b) by 770 days.

(21) Appl. No.: 17/728,469

(22) Filed: Apr. 25, 2022

(65) Prior Publication Data

US 2023/0343833 A1    Oct. 26, 2023

(51) Int. Cl.
*H10D 62/80* (2025.01)
*H10D 30/01* (2025.01)
*H10D 30/47* (2025.01)
*H10D 62/17* (2025.01)
*H10D 64/01* (2025.01)
*H10D 64/27* (2025.01)
*H10D 84/01* (2025.01)
(Continued)

(52) U.S. Cl.
CPC .......... *H10D 62/80* (2025.01); *H10D 30/025* (2025.01); *H10D 30/0318* (2025.01); *H10D 30/485* (2025.01); *H10D 62/292* (2025.01); *H10D 84/0167* (2025.01); *H10D 84/0186* (2025.01); *H10D 84/0195* (2025.01); *H10D 84/038* (2025.01); *H10D 84/85* (2025.01); *H10D 64/01* (2025.01); *H10D 64/512* (2025.01)

(58) Field of Classification Search
CPC ...... H10D 84/85; H10D 30/47; H10D 62/122; H10D 30/63; H10D 84/016; H10D 84/0195; H10D 30/4732; H10D 30/477; H10D 30/478; H10D 30/6757; H10D 62/292; H10D 30/485; H10D 30/481; H10D 30/025; H10D 30/0318; H10B 63/34
See application file for complete search history.

(56) References Cited

U.S. PATENT DOCUMENTS

| | | |
|---|---|---|
| 9,337,210 B2 | 5/2016 | Karda |
| 9,553,199 B2 | 1/2017 | Hou |
| 10,134,915 B2 | 11/2018 | Colinge |

(Continued)

OTHER PUBLICATIONS

Chuang et al., "Low-resistance 2D/2D ohmic contacts: A universal approach to high-performance WSe2, MoS2, and MoSe2 transistors", Nano Lett. 2016, 16, 3, 1896-1902, Publication Date: Feb. 4, 2016, United States, <https://www.osti.gov/servlets/purl/1334435>.

*Primary Examiner* — William B Partridge
*Assistant Examiner* — Alexandre X Ramirez
(74) *Attorney, Agent, or Firm* — David K. Mattheis

(57) ABSTRACT

A semiconductor device including a semiconductor substrate, a lower metal contact disposed upon the semiconductor substrate, a gate structure disposed upon the lower metal contact, an upper metal contact disposed upon the gate structure, and a plurality of semiconductor carriers disposed in contact with both the lower metal contact and the upper metal contact, the plurality of semiconductor carriers disposed in channels passing through the gate structure.

17 Claims, 17 Drawing Sheets

(51) Int. Cl.
 *H10D 84/03* (2025.01)
 *H10D 84/85* (2025.01)

(56) References Cited

U.S. PATENT DOCUMENTS

| | | |
|---|---|---|
| 10,388,732 B1 | 8/2019 | Frougier |
| 10,910,473 B2 | 2/2021 | Park |
| 11,069,819 B2 | 7/2021 | Frougier |
| 11,177,182 B2 | 11/2021 | Yang |
| 11,227,864 B1 | 1/2022 | Saeedi Vahdat |
| 2004/0075148 A1* | 4/2004 | Kumagai ............. H10D 30/791 257/369 |
| 2013/0049120 A1* | 2/2013 | Sandhu .............. H10D 30/6735 257/E29.264 |
| 2014/0131698 A1 | 5/2014 | Kim |
| 2016/0063163 A1* | 3/2016 | Moroz .................... G06F 30/39 716/110 |
| 2018/0122793 A1* | 5/2018 | Moroz ................. G06F 30/392 |
| 2018/0294351 A1* | 10/2018 | Shen .................... H10D 30/031 |
| 2020/0194434 A1 | 6/2020 | Alzate Vinasco |
| 2021/0043756 A1* | 2/2021 | Colinge ................ H01L 21/426 |

\* cited by examiner

100

100

100

100

200

TRANSITION METAL DICHALCOGENIDE (TMD) TRANSISTOR STRUCTURE

BACKGROUND

The disclosure relates generally to transistor devices. The disclosure relates particularly to transistor devices with vertical two-dimensional (2D) transition metal dichalcogenide (TMD) carriers.

2D materials incorporated into device designs represent a promising device architecture for downscaling field effect transistor (FET) structures. Typical designs may include TMD carriers having semiconductor properties.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later.

In one aspect, a semiconductor device includes a semiconductor substrate, a lower metal contact disposed upon the semiconductor substrate, a gate structure disposed upon the lower metal contact, an upper metal contact disposed upon the gate structure, and a first plurality of semiconductor carriers which are two dimensional TMD material disposed in contact with both the lower metal contact and the upper metal contact, the plurality of semiconductor carriers disposed in channels passing through the gate structure.

In one aspect, a semiconductor device includes a semiconductor substrate, a lower metal contact disposed upon the semiconductor substrate, a gate structure comprising a first doped region and a second doped region, disposed upon the lower metal contact, an upper metal contact disposed upon the gate structure, and a first plurality of semiconductor carriers which are two dimensional TMD material disposed in contact with both the lower metal contact and the upper metal contact, the plurality of semiconductor carriers disposed in channels passing through the first doped region of the gate structure.

In one aspect, a method of fabricating a semiconductor device, the method comprising, forming a first metal contact upon a semiconductor substrate, forming a gate structure upon at least a portion of the lower metal contact, forming a first plurality of vertical carriers which are two dimensional TMD material in channels within the gate structure, and forming an upper metal contact adjacent to the gate structure and an upper end of the plurality of vertical carriers.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Figure 1:
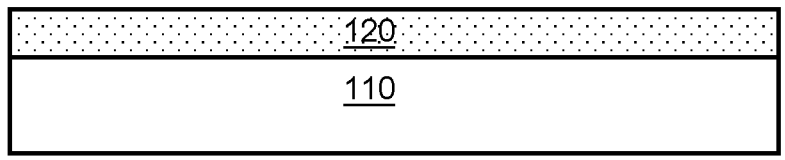
FIG. 1 provides a cross-sectional view of a step in the fabrication of a semiconductor device, according to an embodiment of the invention. The figure illustrates a device substrate including an upper SiO2 oxidation layer.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

It is to be understood that aspects of the present invention will be described in terms of a given illustrative architecture; however, other architectures, structures, substrate materials and process features, and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above"

the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Deposition processes for the metal liner and sacrificial material include, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Transition metal dichalcogenides represent an opportunity to design and fabricate semiconductor devices having elements effectively reduced to 2 dimensions as the TMD materials may be utilized in elements having an atomic thickness. Such materials have a generalized formula of MX2, where M represents a transition metal (Mo, W, etc.) and X represents a chalcogen atom (S, Se, Te). Such materials can have a planar structure and also exhibit semiconductor behaviors. Use of such materials enables further reduction in the dimensions of semiconductor devices.

These materials suffer from poor "on" state current due to low contact resistivity and poor channel mobility. In contrast to Silicon, TMD materials can typically be used for a single polarity. Disclosed embodiments utilize vertical TMD nanosheet carriers in the formation of NFET and PFET devices. Application of a voltage at the gate input of such devices activates the TMD carriers enabling current flow across the carriers between the various contacts of the PFET and NFET devices according to the nature of the applied voltage.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Reference is now made to the figures. The figures provide schematic cross-sectional illustration of semiconductor devices at intermediate stages of fabrication, according to one or more embodiments of the invention. The figures provide a front cross-section of typical devices according to the invention. The figures provide schematic representations of the devices of the invention and are not to be considered accurate or limiting with regards to device element scale.

FIG. 1 illustrates device 100 at an early stage of fabrication after formation of substrate 110 and insulating layer 120. Substrate 110 can be composed of any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). An insulating layer 120 may be present on substrate 110 and, if present, is located between substrate 110 and the TMD based devices. Insulating layer 120 can be, for example, a buried oxide layer (typically $SiO_2$) or a bottom dielectric isolation layer formed early in the process (typically SiN, SiBCN, SiOCN, SiOC, or any combination of low-k materials).

Figure 2:
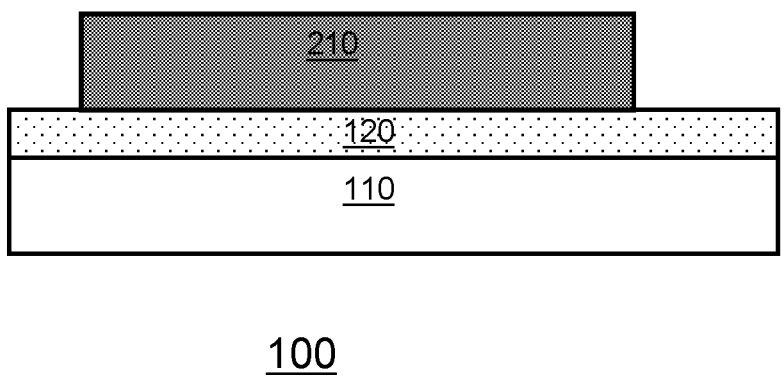
FIG. 2 provides cross-sectional views of a step in the fabrication of a semiconductor device, according to an embodiment of the invention. The figure illustrates the device following deposition and patterning of a lower metal contact.

FIG. 2 illustrates device 100 following deposition, lithographic patterning, and selective etching of a lower metal contact layer 210. Exemplary lower metal contact layer 210 materials include conductive metal such as Cu, Ag, Au, W, Co, Ru.

Figure 3:
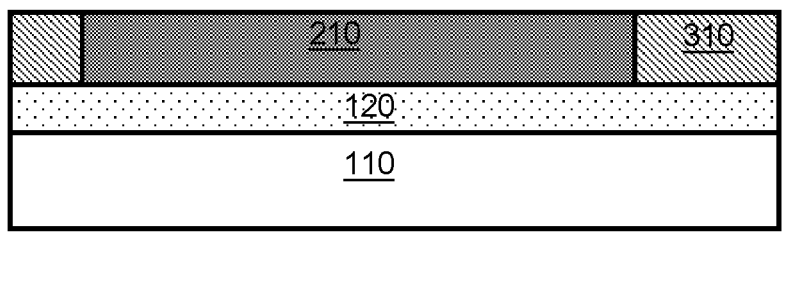
FIG. 3 provides a cross-sectional view of a step in the fabrication of a semiconductor device, according to an embodiment of the invention. The figure illustrates the device following deposition and planarization of an inter-layer dielectric material around the lower metal contact.

FIG. 3 illustrates device 100 following deposition and chemical-mechanical-planarization (CMP) of interlayer dielectric (ILD) 310. Exemplary ILD materials include SiO2, SiN, SiOC, low-k dielectric (k<3.9), and combinations thereof. As shown in the Figure, CMP of device 100 recesses ILD 310 and lower contact 210, to the desired contact thickness. In an embodiment, contact thickness ranges between about 1nm and about 2000 nm.

Figure 4:
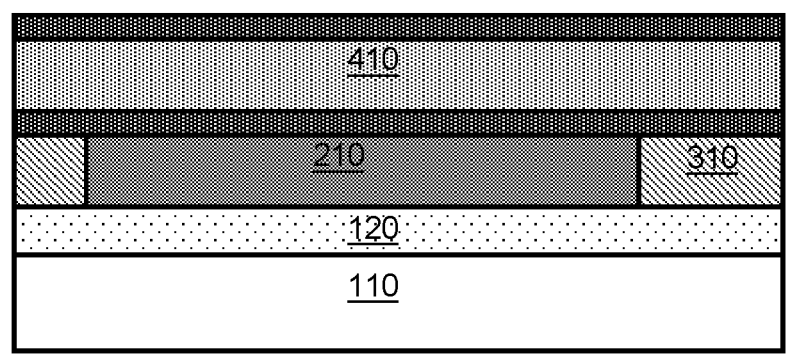
FIG. 4 provides a cross-sectional view of a step in the fabrication of a semiconductor device, according to an embodiment of the invention. The figure illustrates the device after the deposition of a gate structure including a lower spacer, a ply-crystalline Si layer, and an upper spacer.

FIG. 4 illustrates device 100 following formation of a gate structure 410, upon the lower contact 210, and ILD 310. Gate structure 410 include upper and lower insulating spacers, which may be comprised of any one or more of a variety of different insulative materials, such as $Si_3N_4$, SiBCN, SiNC, SiN, SiCO, $SiO_2$, SiNOC, etc., sandwiching a gate layer comprising polycrystalline silicon, or a gate metal such as any known metal gate material including TiN, TiAl, TiC, TiAlC, tantalum (Ta) and tantalum nitride (TaN), W, Ru, Co, Al.

Figure 5:
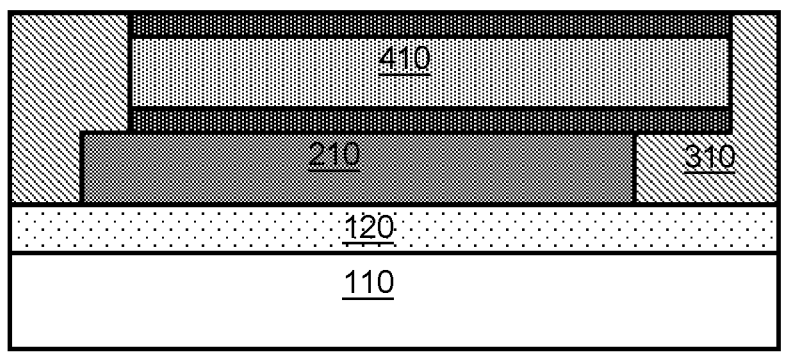
FIG. 5 provides a cross-sectional view, of a step in the fabrication of a semiconductor device, according to an embodiment of the invention. The figure illustrates the device after the patterned etching of the gate structure. The figure further illustrates the device after the deposition and planarization of inter-layer dielectric material around the gate structure.

FIG. 5 illustrates device 100 following lithographic patterning and selective etching to form the final desired shape for the gate structure 410. As shown in the Figure, gate structure 410 overlaps a portion of lower contact 210 and includes a portion overlapping ILD 220. In an embodiment, the gate structure including the insulating spacers has a thickness of between about 0.5 nm and about 20 nm. FIG. 5 further illustrates the encapsulation of the gate structure 410 in additional ILD material 220, followed by CMP to the upper surface of the upper spacer of gate structure 410.

Figure 6:
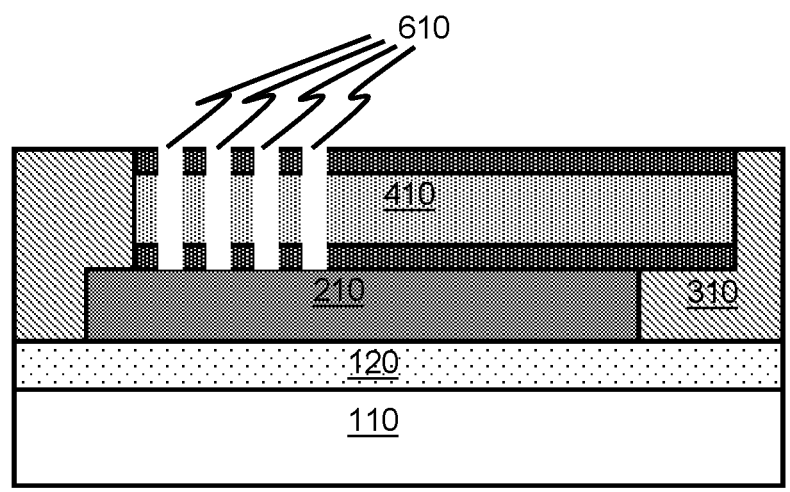
FIG. 6 provides a cross-sectional view of a step in the fabrication of a semiconductor device, according to an embodiment of the invention. The figure illustrates the device after the formation of carrier slots in the gate structure.

FIG. 6 illustrates device 100 following formation of a plurality of slots 610 through gate structure 410 to the upper surface of lower contact 210 for a first transistor. Such slots may be formed using known lithographic and reactive ion etching techniques. In an embodiment, such slots have a width of between about 0.1 nm and about 10 nm, and a length of between about 1nm and about 500 nm.

Figure 7:
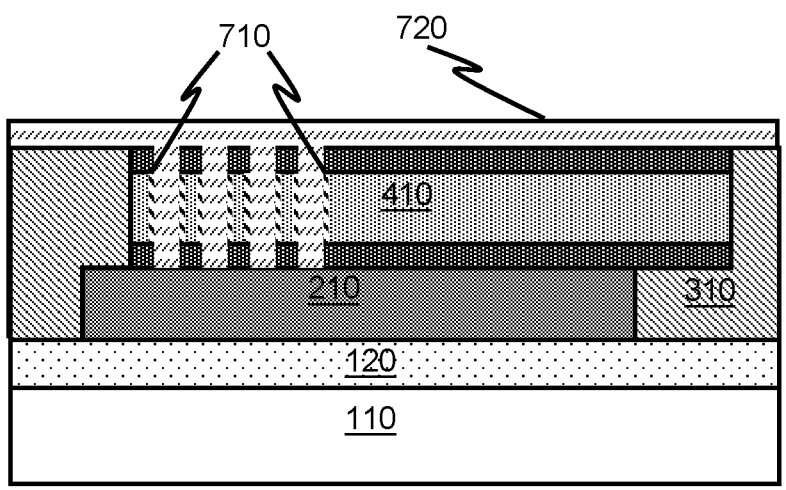
FIG. 7 provides a cross-sectional view of a step in the fabrication of a semiconductor device, according to an embodiment of the invention. The figure illustrates the device after the oxidation of the slot sidewalls and the growth of the vertical carriers.

FIG. 7 illustrates device 100 following formation of oxide layers 710, favorable to the growth of TMD vertical carriers upon the walls of the slots. In an embodiment, in-situ-steam generation results in the formation of the desired oxide upon the surfaces of slots 610. The Figure further illustrates device 100 following growth via CVD of vertical carriers 720, such as $WS_2$, $MoS_2$, $WSe_2$ and any other n-Type TMD material, in slots 610.

Figure 8:
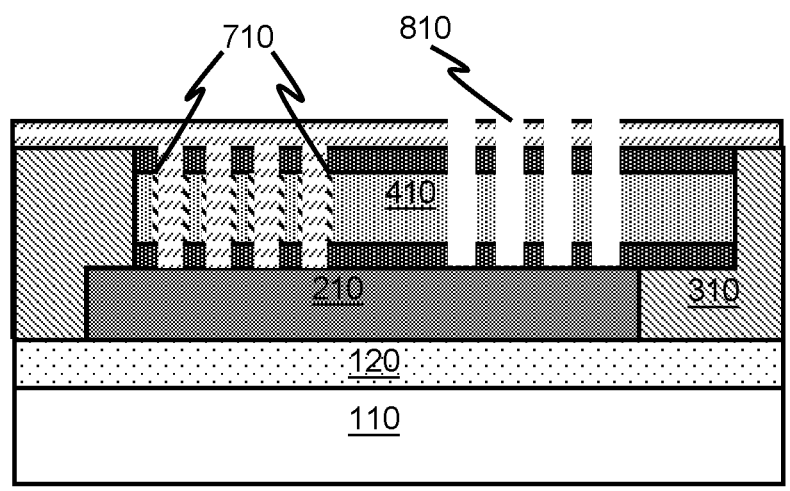
FIG. 8 provides a cross-sectional view of a step in the fabrication of a semiconductor device, according to an embodiment of the invention. The figure illustrates the device after the formation of carrier slots for a second transistor in the gate structure.

FIG. 8 illustrates device 100 following formation of slots 810 associated with a second transistor, through gate structure 410 to the upper surface of lower contact 210. Slots 810 comprise dimensions similar to those of slots 610 associated with the first transistor.

Figure 9:
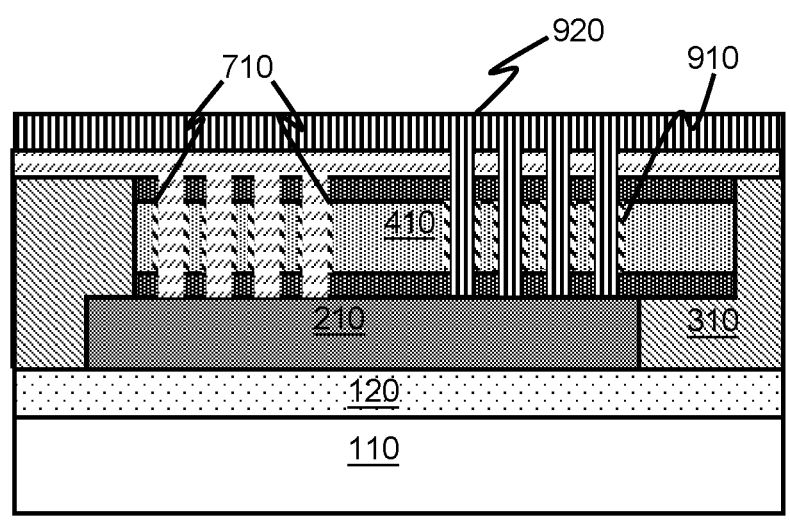
FIG. 9 provides a cross-sectional view of a step in the fabrication of a semiconductor device, according to an embodiment of the invention. The figure illustrates the device after the oxidation of the sidewalls of the second transistor slots and the growth of carrier material in the slots.

FIG. 9 illustrates device 100 following formation of oxide layers 910 favorable to the growth off vertical TMD layers upon the walls of slots 810. In an embodiment, in-situ-steam generation results in the formation of the desired oxide upon the surfaces of slots 810. The Figure further illustrates device 100 following growth via CVD of vertical carriers 920, such as p-type Tungsten (W)-based TMDs having substitutional Ta-doping, and any p-type TMD material, including $WSe_2$, black phosphorous, or similar materials, in slots 810. In-situ-steam generation yields oxide formation upon the vertical surfaces of slots 810 prior to growth of the TMD material carriers.

Figure 10:
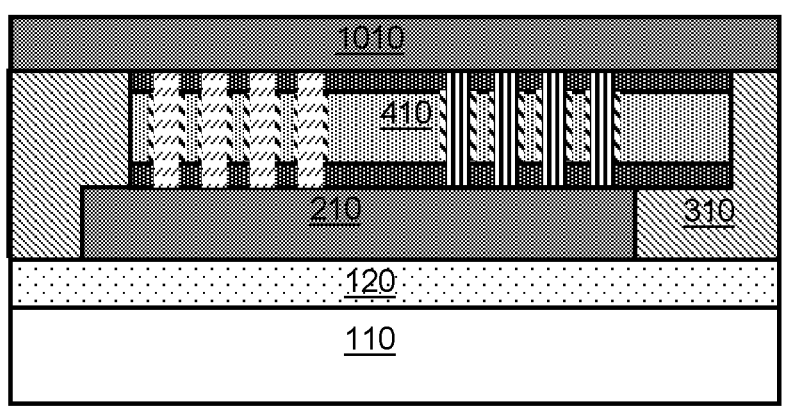
FIG. 10 provides a cross-sectional view of a step in the fabrication of a semiconductor device, according to an embodiment of the invention. The figure illustrates the device after planarization of the carrier materials and deposition of an upper metal contacts layer.

FIG. 10 illustrates device 100 following CMP of residual TMD materials and deposition of an upper metal layer 1010, suitable for etching to form upper transistor contacts. Exemplary contact materials include conductive metal such as Cu, Ag, Au, W, Co, Ru.

Figure 11:
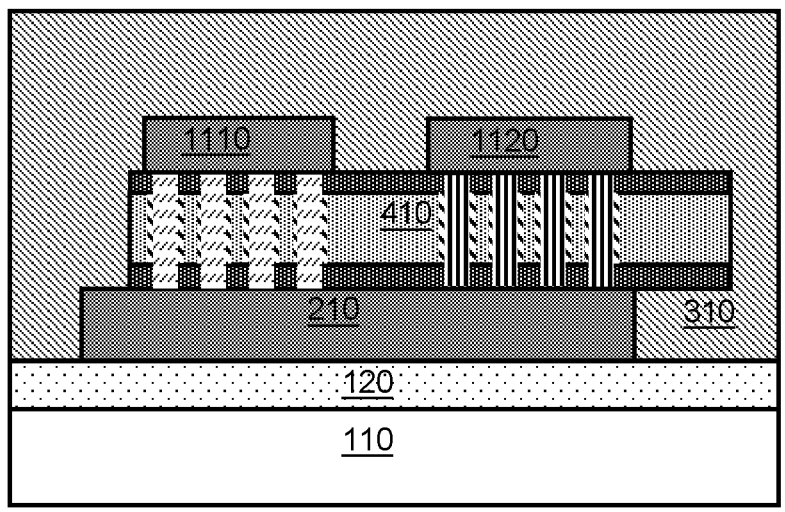
FIG. 11 provides a cross-sectional view of a step in the fabrication of a semiconductor device, according to an embodiment of the invention. The figure illustrates the device after patterned etching of the upper device contacts and deposition of additional inter-layer dielectric material.

FIG. 11 illustrates device 100 following lithographic patterning and selective etching of upper contact layer 1010, to form first and second device upper contacts, 1110, and 1120. In an embodiment, upper contact thicknesses range between about 1nm and about 2000 nm. The Figure further illustrates the device following the deposition of additional ILD material 220.

Figure 12:
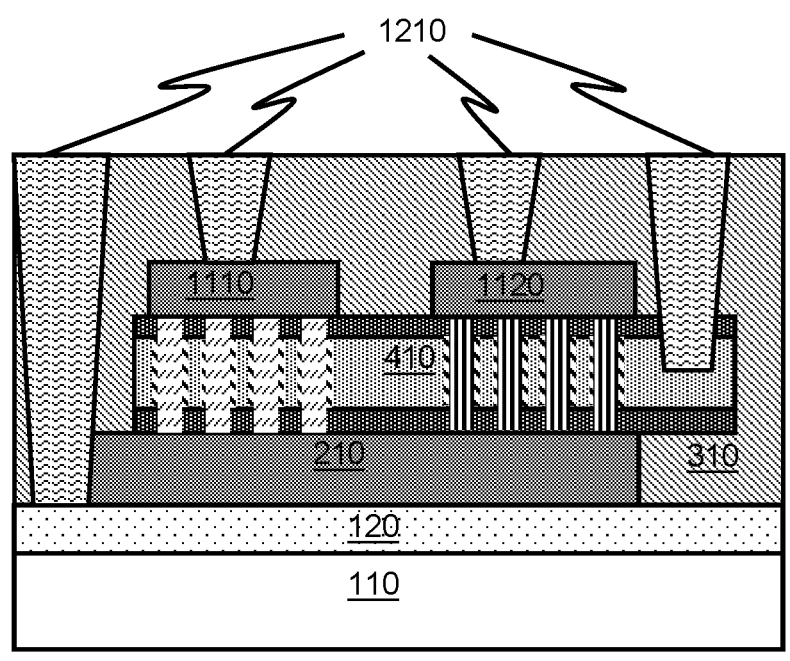
FIG. 12 provides a cross-sectional view of a step in the fabrication of a semiconductor device, according to an embodiment of the invention. The figure illustrates the device after the formation of device contact vias and the deposition of device contact materials in the vias.

FIG. 12 illustrates device 100 following the formation of device contacts 1210 in associated vias. After selectively etching vias of the respective contacts, deposition of contact materials, such as conductive metal such as Cu, Ag, Au, W, Co, Ru, and CMP of the device, completes the formation of the device contacts. Following this stage of fabrication, addition middle of line or back of line fabrication steps may be undertaken to complete the device.

Figure 13:
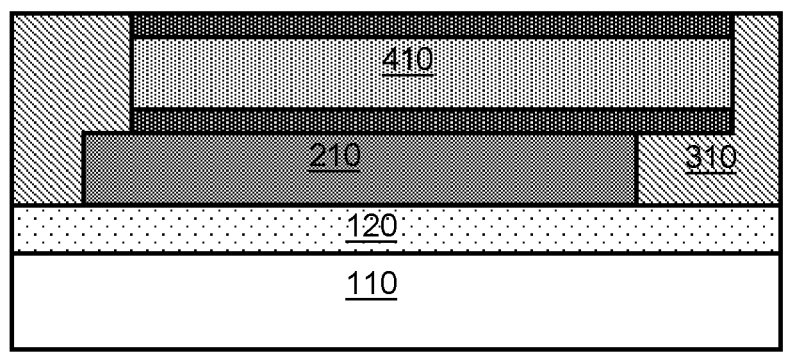
FIG. 13 provides a cross-sectional view of a step in the fabrication of a semiconductor device, according to an embodiment of the invention. The figure illustrates the device after formation of the lower device contact and the gate structure upon the lower contact.

FIG. 13 illustrates a stage in the fabrication of device 200 according to a second embodiment of the invention. The Figure illustrates device 200 following formation of the substrate 110 and insulating layer 120, as described above, in addition to formation of lower metal contact 210, and ILD 220, together with gate structure 410. In this embodiment, gate structure 410 comprises a polycrystalline silicon structure.

Figure 14:
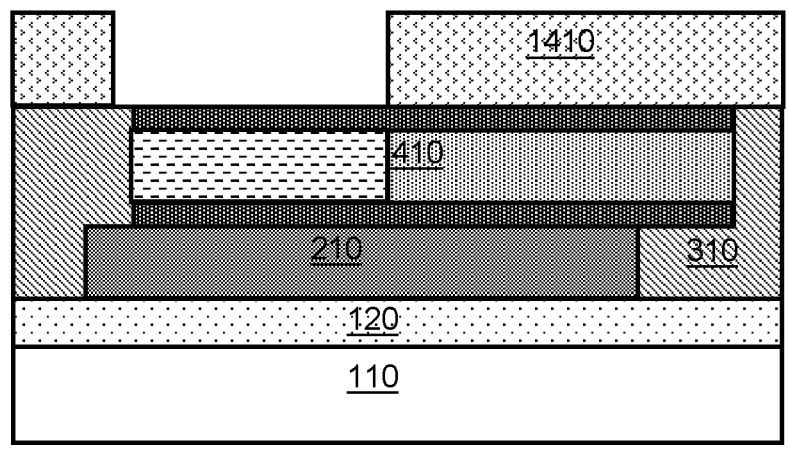
FIG. 14 provides a cross sectional view of a step in the fabrication of a semiconductor device, according to an embodiment of the invention. The figure illustrates the device after formation of a masking layer enabling selective ion implantation for a first portion of the gate structure associated with a first transistor.

FIG. 14 illustrates device 200 following deposition, lithographic patterning and selective etching of a hardmask 1410, revealing a portion of gate structure 410 associated with the first transistor. Hard mask 1410 includes a nitride, oxide, an oxide-nitride bilayer, or another suitable material. In some embodiments, the hard mask 1410 may include an oxide such as silicon oxide (SiO), a nitride such as silicon nitride (SiN), an oxynitride such as silicon oxynitride (SiON), combinations thereof, etc. In some embodiments, the hard mask 1410 is a silicon nitride such as $Si_3N_4$. In an embodiment, the exposed portion of gate 410 is subjected to ion bombardment with arsenic, antimony, phosphorous, or similar ions, to alter the threshold voltage of the NFET transistor of device 200.

Figure 15:
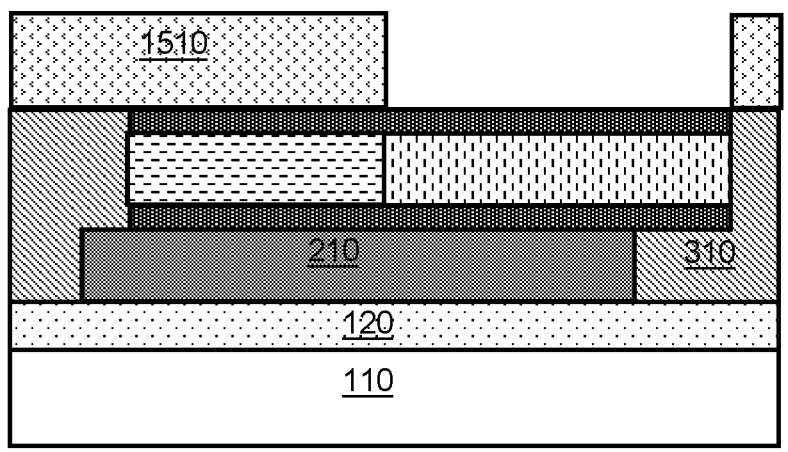
FIG. 15 provides a cross-sectional view of a step in the fabrication of a semiconductor device, according to an embodiment of the invention. The figure illustrates the device after formation of a masking layer enabling selective ion implantation for a second portion of the gate structure associated with a second transistor.

FIG. 15 illustrates device 200 following deposition, lithographic patterning and selective etching of a hardmask 1510, revealing a portion of gate structure 410 associated with the second transistor. Hard mask 1510 includes a nitride, oxide, an oxide-nitride bilayer, or another suitable material. In some embodiments, the hard mask 1510 may include an oxide such as silicon oxide (SiO), a nitride such as silicon nitride (SiN), an oxynitride such as silicon oxynitride (SiON), combinations thereof, etc. In some embodiments, the hard mask 1510 is a silicon nitride such as $Si_3N_4$. In an embodiment, the exposed portion of gate 410 is subjected to ion bombardment with aluminum, boron, gallium, indium, or similar ions, to alter the threshold voltage of the PFET transistor of device 200.

Figure 16:
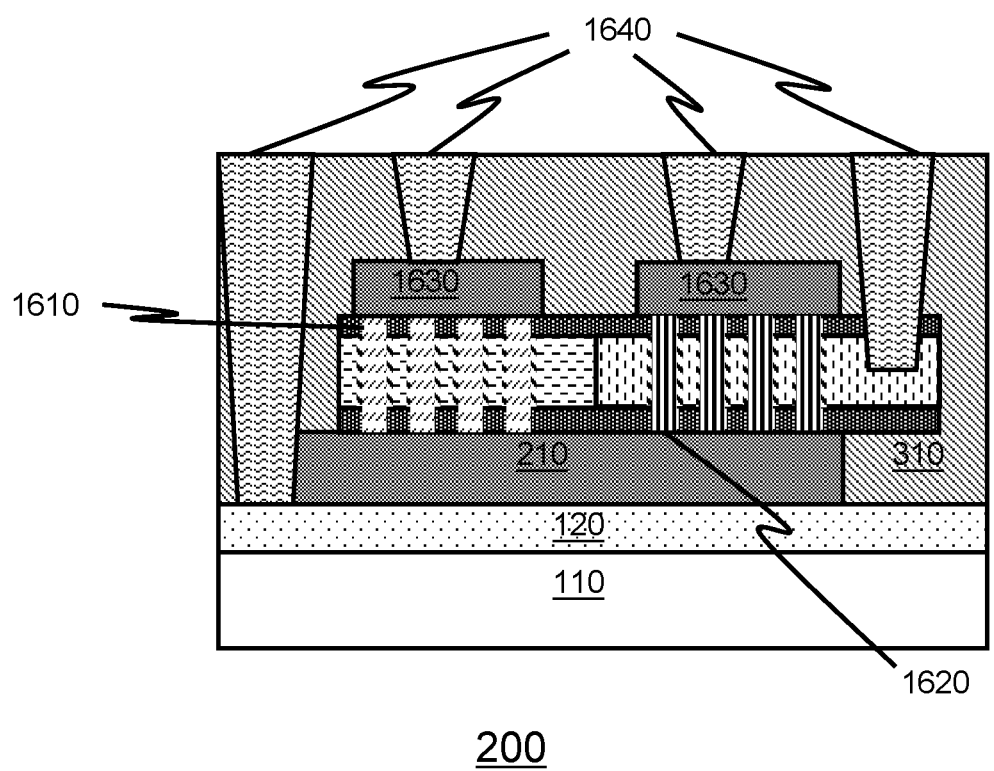
FIG. 16 provides a cross-sectional view of a step in the fabrication of a semiconductor device, according to an embodiment of the invention. The figure illustrates the device after formation of the vertical carriers for each of the first and second transistors, as well as the formation of upper metal contacts for each transistor and the device contact vias and contacts.

FIG. 16 illustrates device 200 following formation of vertical carriers 1610, 1620, upper metal contacts 1630, and device contacts 1640, for device 200, similar to such structures described above with respect to device 100. As shown in the Figure, carriers 1610 pass through the NFET portion of gate structure 410, and carriers 1620, pass though the PFET portion of gate structure 410. In an embodiment, carriers 1610 comprises a first TMD material and carriers 1620 comprise a second TMD material.

Figure 17:
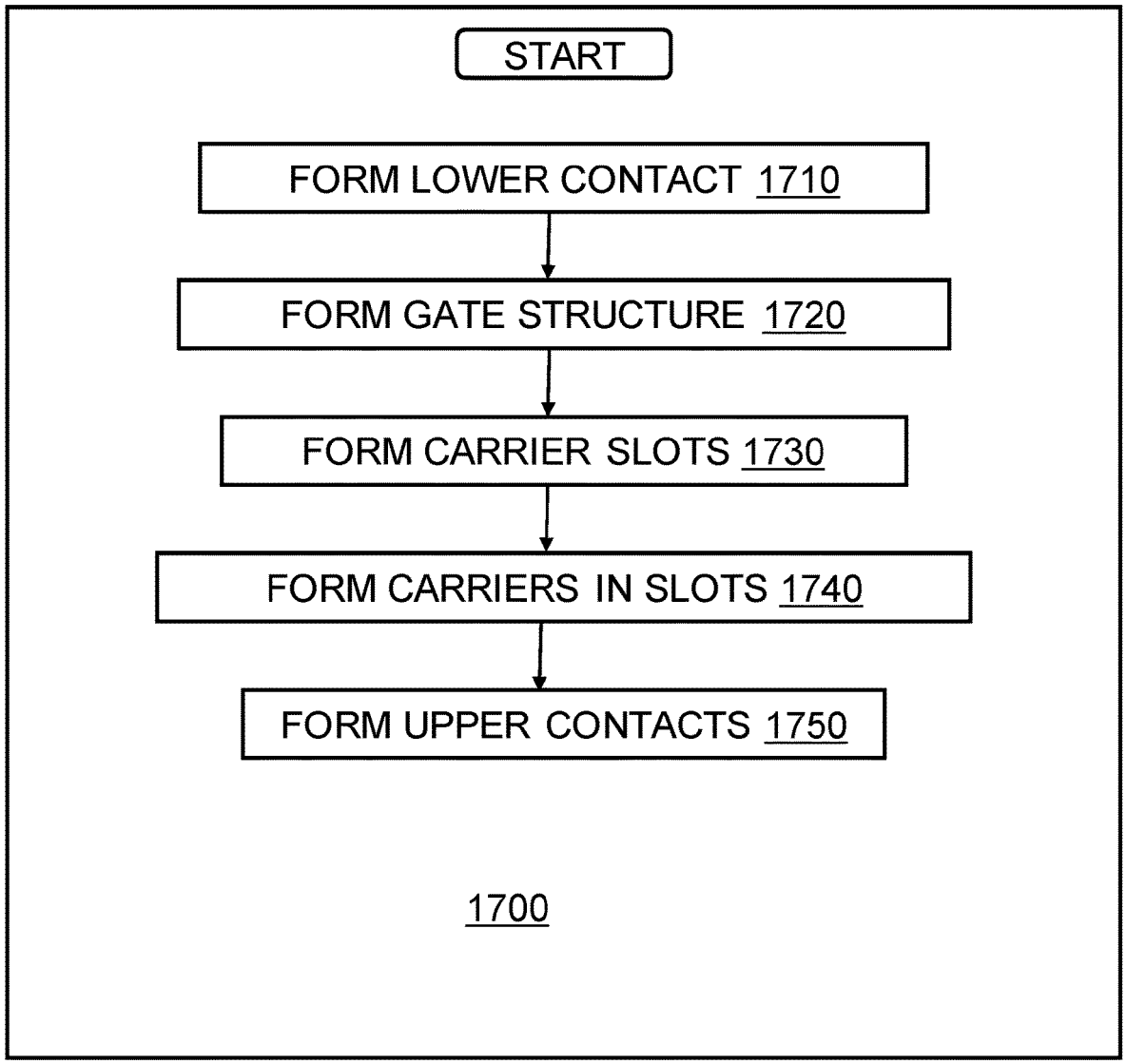
FIG. 17 provides a flowchart depicting operational steps for forming semiconductor device, according to an embodiment of the invention.

FIG. 17 provides a flowchart setting forth operational steps of a method for the fabrication of devices according to an embodiment of the invention. At block 1710, the method forms a lower metal contact upon a semiconductor substrate. At block 1720, the method forms a gate structure including insulating spacer layers, upon the lower metal contact. At block 1730, the method forms a plurality of vertical slots through the gate structure, exposing the upper surface of the lower metal contact.

At block 1740, the method forms vertical carriers in the slots or channels through the gate structure, extending upward form the upper surface of the lower metal contact. In an embodiment, the vertical carriers comprise TMD materials grown upon the surfaces of the slots after such surfaces have been oxidized.

At block 1750, the method forms upper device contacts for the vertical carriers as well as device contacts for the lower contact, the gate structure, and the upper device contacts. Following this step, the device proceeds to additional back end of line fabrication stages.

The flowchart and block diagrams in the figures illustrate the architecture, functionality, and operation of possible implementations of systems, methods, and device fabrication steps according to various embodiments of the present invention. In this regard, each block in the flowchart or block diagrams may represent a module, segment, or portion of instructions, which comprises one or more fabrication steps for manufacturing the specified device(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:
   a semiconductor substrate;
   a lower metal contact disposed upon the semiconductor substrate;
   a gate structure disposed upon the lower metal contact, wherein the gate structure extends beyond an edge of the lower metal contact;
   an upper metal contact disposed upon the gate structure; and
   a first plurality of semiconductor carriers disposed in contact with both the lower metal contact and the upper metal contact, the plurality of semiconductor carriers disposed in channels passing through the gate structure.

2. The semiconductor device according to claim 1, further comprising a second plurality of semiconductor carriers disposed in contact with both the lower metal contact and upper metal contacts, the second plurality of semiconductor carriers disposed in channels passing through the gate structure, wherein each of the first plurality of carriers comprises a first semiconductor material and the second plurality of carriers comprises a second semiconductor material.

3. The semiconductor device according to claim 1, wherein the first plurality of carriers comprises a PFET device.

4. The semiconductor device according to claim 1, wherein the first plurality of carriers comprises a transition metal dichalcogenide material.

5. The semiconductor device according to claim 1, further comprising oxidized polycrystalline silicon adjacent to the first plurality of carriers.

6. The semiconductor device according to claim 1, wherein the substrate comprises an oxide on silicon substrate.

7. The semiconductor device according to claim 1, wherein the first plurality of carriers comprises an NFET device.

8. A semiconductor device comprising:
   a semiconductor substrate;
   a lower metal contact disposed upon the semiconductor substrate;
   a gate structure disposed upon the lower metal contact, the gate structure comprising a first doped region and a second doped region, each of the first doped region and the second doped, region comprising different dopants, wherein the gate structure extends beyond an edge of the lower metal contact;
   an upper metal contact disposed upon the gate structure; and
   a first plurality of semiconductor carriers disposed in contact with both the lower metal contact and the upper metal contact, the plurality of semiconductor carriers disposed in channels passing through the first doped region of the gate structure.

9. The semiconductor device according to claim 8, further comprising a second plurality of semiconductor carriers disposed in contact with both the lower metal contact and upper metal contacts, the second plurality of semiconductor carriers disposed in channels passing through the second doped region of the gate structure, wherein each of the first plurality of carriers and the second plurality of carriers comprises a unique semiconductor material.

10. The semiconductor device according to claim 8, wherein the first plurality of carriers comprises a PFET device.

11. The semiconductor device according to claim 8, wherein the first plurality of carriers comprises a transition metal dichalcogenide material.

12. The semiconductor device according to claim 8, further comprising oxidized polycrystalline silicon adjacent to the first plurality of carriers.

13. The semiconductor device according to claim 8, wherein the substrate comprises an oxide on silicon substrate.

14. The semiconductor device according to claim 8, wherein the first plurality of carriers comprises an NFET device.

15. A method of fabricating a semiconductor device, the method comprising:
    forming a lower metal contact upon a semiconductor substrate;
    forming a gate structure upon at least a portion of the lower metal contact;
    forming a plurality of vertical carriers in channels within the gate structure;
    forming a second plurality of vertical carriers in channels within the gate structure; and
    forming an upper metal contact adjacent to the gate structure and an upper end of the plurality of vertical carriers.

16. The method of fabricating a semiconductor device according to claim 15, wherein the plurality of vertical carriers comprises a two-dimensional TMD material.

17. The method of fabricating a semiconductor device according to claim 15, wherein the plurality of vertical carriers comprises a PFET device, and the second plurality of vertical carriers comprises an NFET device.

* * * * *